US008558598B2

(12) United States Patent
Walker et al.

(10) Patent No.: US 8,558,598 B2
(45) Date of Patent: Oct. 15, 2013

(54) PHASE SHIFT GENERATING CIRCUIT

(75) Inventors: James T. Walker, Palo Alto, CA (US); Andrew Read, Sunnyvale, CA (US)

(73) Assignee: Supertex, Inc., Sunnyvale, CA (US)

( * ) Notice: Subject to any disclaimer, the term of this patent is extended or adjusted under 35 U.S.C. 154(b) by 531 days.

(21) Appl. No.: 12/722,320

(22) Filed: Mar. 11, 2010

(65) Prior Publication Data
US 2010/0231279 A1 Sep. 16, 2010

Related U.S. Application Data

(60) Provisional application No. 61/160,677, filed on Mar. 16, 2009.

(51) Int. Cl.
*H03H 11/16* (2006.01)
*H03K 5/13* (2006.01)
*H03K 3/00* (2006.01)
*H03K 7/08* (2006.01)
*H03K 9/08* (2006.01)
*G06F 1/04* (2006.01)

(52) U.S. Cl.
USPC ........... 327/237; 327/258; 327/291; 327/295; 375/238; 375/375

(58) Field of Classification Search
USPC ......... 327/231, 232, 237, 241, 242, 257, 258, 327/291, 295; 375/238, 375, 376
See application file for complete search history.

(56) References Cited

U.S. PATENT DOCUMENTS

| | | | |
|---|---|---|---|
| 4,686,483 A * | 8/1987 | Isshiki et al. | 327/552 |
| 4,688,209 A | 8/1987 | Banzi et al. | |
| 5,831,929 A | 11/1998 | Manning | |
| 5,905,406 A * | 5/1999 | Sugden et al. | 329/312 |
| 7,215,272 B2 * | 5/2007 | Lee | 341/152 |
| 7,378,893 B1 * | 5/2008 | Kang | 327/291 |
| 7,425,856 B2 | 9/2008 | Abel et al. | |
| 7,439,787 B2 * | 10/2008 | Hashim et al. | 327/172 |
| 7,443,219 B2 | 10/2008 | Rausch | |
| 7,446,582 B2 | 11/2008 | Glatzmaier | |
| 7,453,301 B1 | 11/2008 | Kaviani | |
| 7,466,179 B2 | 12/2008 | Huang et al. | |
| 2002/0033701 A1 | 3/2002 | Macbeth et al. | |
| 2008/0018372 A1 | 1/2008 | Nose et al. | |
| 2008/0024065 A1 | 1/2008 | Yakoviev et al. | |
| 2009/0027098 A1 | 1/2009 | Nguyen | |

OTHER PUBLICATIONS

PCT Search Report and Written Opinion dated May 17, 2010 corresponding to the PCT Patent Application. No. US10/27345.

\* cited by examiner

*Primary Examiner* — Lincoln Donovan
*Assistant Examiner* — Colleen O Toole
(74) *Attorney, Agent, or Firm* — DLA Piper LLP (US)

(57) ABSTRACT

A phase shift generation circuit has an edge detector, which outputs a first and a second edge signal. The circuit also has a divide by N circuit, which receives a first clock signal and a group of signals representing a number N, and outputs a second clock signal. The circuit further comprises a pulse counter, which receives the first edge signal and the second clock signal, and outputs a group of signals representing the number of the second clock pulses between occurrences of the first edge signal. The circuit has first and second recycling timers, which output a group of pulses approximating a uniformly spaced group across the time duration of the period of the input pulse. The circuit also comprises at least one flip flop which generates a phase shifted output pulse.

7 Claims, 4 Drawing Sheets

PHASE SHIFT GENERATING CIRCUIT

TECHNICAL FIELD

The present invention relates to a circuit that accepts a pulse train of arbitrary frequency and pulse duration, within a wide set of limits, and outputs a set of replica pulse trains which have various timing phases.

BACKGROUND OF THE INVENTION

LEDs have found increasing usage due to their ability to conserve energy, and their longevity. The ability to control the dimming of LEDs in an efficient manner is thus desirable.

Thus, one objective of the present invention is a phase shift generation circuit which can adapt to variations in the number of phases needed for its output. By changing a digital number which is input to the system, the number of output phases generated can be varied, and the active outputs will maintain their even distribution over the period of the input pulse train. This feature permits the system to respond to external changes which result in changing the number of active LED channels, either as a result of user commands or other variations in the system performance. So for example, if it is detected that an LED output has failed, that output can be turned off, and the remaining LED output phases will redistribute evenly over the period of the pulse train period. This minimizes the amount of acoustic, electrical, and RF noise generated by the LED current pulses in a sensitive frequency range.

Another objective of this invention is a phase shift generation circuit that can automatically adapt to failures in the associated system, so that when channels in the associated system fail to operate correctly and are shut off, the remaining channels will operate with a uniform phase distribution. Output channels may fail for many reasons external to the integrated circuit used to realize the phase shift system, such as broken connections and open light emitting diodes. Control signals from the associated system will provide information about which channels are not functioning. In this case, a first logic block is used to count the number of operational channels, and a second logic block is used to assign the active pulse phase outputs of this invention to the active channels of the associated system. The counting block simply outputs a numerical code corresponding to the number of active channels, and this code is used as one input to the phase generation system. The assignment block receives information about which channels are disabled and assigns the active phase pulse outputs to the active channels to give a uniform pulse distribution.

SUMMARY OF THE INVENTION

These objectives and other objectives are realized by the phase shift generation circuit of the present invention in which an edge detector, receives an input pulse signal and outputs a first and a second edge signal denoting the time of occurrence of the first and second edges of the input pulse signal. The circuit also has a divide by N circuit, which receives a first clock signal and a group of signals representing a number N, and outputs a second clock signal, said a second clock signal having a frequency equal to the frequency of said first clock signal divided by the number N. The circuit further comprises a pulse counter, which receives the first edge signal and the second clock signal, and outputs a group of signals representing the number of the second clock pulses between occurrences of the first edge signal. The circuit has a first recycling timer, which receives the number of second clock pulses, the first edge signal and the first clock signal, and outputs a group of pulses approximating a uniformly spaced group across the time duration of the period of the input pulse. The group is spaced by the number of second clock pulses. The circuit also has a second recycling timer, which receives the number of second clock pulses, the second edge signal and the first clock signal, and outputs a group of pulses approximating a uniformly spaced group across the time duration of the period of the input pulse. The group is spaced by the number of second clock pulses. The circuit also comprises at least one flip flop with set and reset inputs. The set input receives a pulse from the second recycling timer, while the reset input receives a corresponding pulse from the first recycling timer. The flip flop generates a phase shifted output pulse.

DETAILED DESCRIPTION OF THE PREFERRED EMBODIMENT

Figure 1:
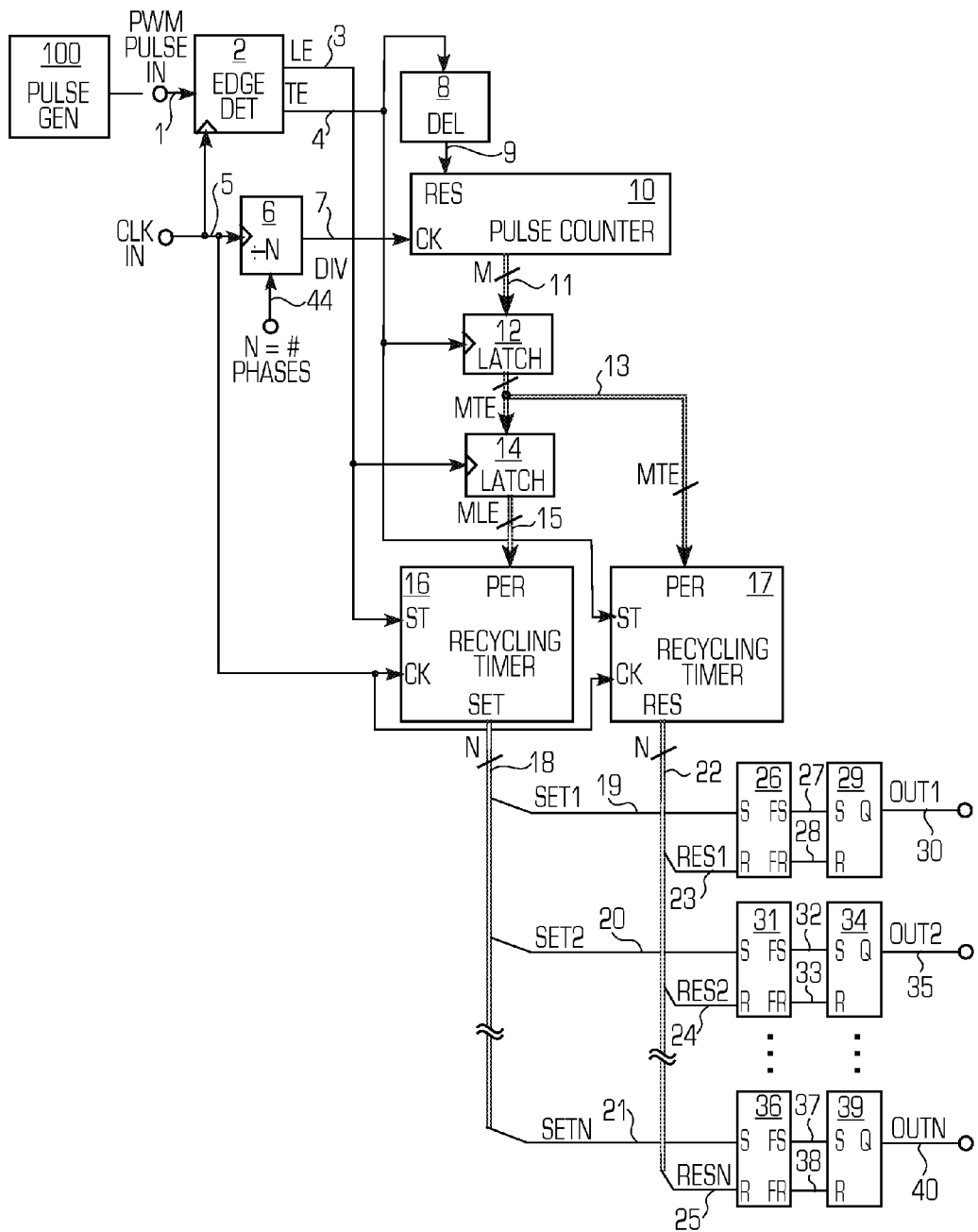
FIG. 1 is a circuit block diagram of a first embodiment of a phase shift generating circuit of the present invention.

Referring to FIG. 1 there is shown a first embodiment of a phase shift generation circuit of the present invention. The input signal is a Pulse Width Modulated (PWM) pulse train signal which is to be phase shifted and is input on wire 1 to an edge detection circuit 2. The input signal is typically a pulse train in the 200 Hz to 20 KHz frequency range, provided either from an external pulse source, or from an analog or digital pulse generator 100 in the same integrated circuit chip containing the disclosed circuit. For example, in a portable computer system where the phase shifted outputs are used to control the pulsing of light emitting diodes (LED) for back lighting of the display panel, the input PWM pulse signal is often provided by the central processing unit (CPU), sometimes using one of its auxiliary circuits. In more fully integrated systems, the oscillator for the PWM source is on the same chip as the phase shifting circuitry. The present invention encompasses both analog and digital pulse generators 100, depending on the chip manufacturer. The edge detection circuit 2 may be implemented by either digital or analog means. It is most convenient to use a digital edge detection circuit as known in the state of the art to produce two outputs. These outputs typically are a short pulse with a duration of one clock cycle at the clock frequency Fclk, although they could have some other duration if desired. The clock Fclk is used to operate all counter flip flops in the circuits disclosed here, except for the ones in the pulse counter block 10. The first output for the leading edge (LE) on wire 3 of the edge detector signals when the input pulse 1 goes from a logic low (L) or 'zero' state to a logic high (H) or 'one' state. This is denoted as the leading edge (LE) of the input waveform PWM on wire 1. The second output for the trailing edge (TE) on wire 4 of the edge detector signals when the input pulse 1 goes from a logic high (H) or 'one' state to a logic low (L) or 'zero' state. This is denoted as the trailing edge (TE) of the input waveform PWM on wire 1.

Action of the circuit begins with use of the TE signal 4 to measure the period of the incoming pulse train. The signal TE is used to save the current count value of a pulse counter 10, as expressed as the number M on wire group 11, in a storage register or latch 12. A small delay after the current count value M is saved, an output signal 9 generated from TE by a delay device 8 is used to reset the contents of the pulse counter 10 to its starting number, typically zero. In this way, the latch 12 ends up storing a digital number corresponding to the period of the incoming pulse train PWM from wire 1. The output of the latch 12 is the number MTE, which is expressed as logic signals on the group of wires 13. The role of TE and LE to save the count value of the pulse counter 10 and to reset the count value in the pulse counter 10 can be reversed.

In order to facilitate the generation of the required delay times for phase shifting in the output part of the circuit, the clock frequency for the pulse counter is not the fast clock frequency Fclk from input 5. Instead, the fast clock CLK on 5 is divided by a divide by N circuit 6, in response to an input number N on wire group 44 which represents the number of phases to be generated. This circuit is a counter made as known in the state of the art such that for each N input pulses, it will output one pulse to the subsequent circuits. The output of the divide by N circuit on wire 7 is the signal DIV, which is used to operate the pulse counter 10. As a result, for each N input pulses on wire 5, the pulse counter 10 receives one clock pulse. The clock frequency used for the pulse counter 10 is therefore Fclk divided by N. This causes the pulse counter 10 to measure the period of the input pulse with an altered time scale compared to the timers which will be used later for delay generation.

At a later time, the input signal leading edge will occur, generating the signal LE on wire 3. The LE signal is used to copy the value of the measured input pulse period on wires 13 as MTE into a second latch 14. The output of this latch 14 is the group of wires 15, with logic signals representing the number MLE. This number is the same as MTE at the time of copying, but is being saved in a separate latch 14 for later usage.

Output signal generation begins when the input signal causes a TE pulse and starts a recycling timer 17. This timer 17 uses the number MTE on the wire group 13 to determine what spacing to use for a group of output pulses. The timer 17 counts the clock pulses CLK at a frequency Fclk, which is N times faster than the clock frequency used by the pulse counter 10 to measure the input pulse train. Therefore, it will complete its count sequence in a time which is the input pulse train period divided by N. As a result, the recycling timer 17 can produce a series of pulses which are spaced by the original pulse period divided by N. The division is performed without having to have an explicit set of logic hardware to divide the number represented on the wires 11 by the number N, as would be necessary if the pulse counter 10 and the recycling timer 17 used the same clock frequency. Each pulse output from the recycling timer 17 comes out on a different wire in the group 22 containing N wires. Each of the wires in the group 22 is used to control a different phase of the output pulse set. Thus the first pulse receives the signal RES1 on wire 23, the second receives the signal RES2 on wire 24, etc down to the last pulse receiving the signal RESn on wire 25 as shown. This implementation envisions the generation of N distinct output pulses distributed evenly over the period of the input pulse PWM on wire 1.

At a later time, the input signal causes an LE pulse and starts a second recycling timer 16. This timer 16 uses the number MLE on the wire group 15 to determine when to generate the other edge of each of the output pulses. The timer 16 counts the clock pulses CLK at the frequency Fclk as done by timer 17, so it completes its count sequence at a rate N times faster than the clock frequency used by the pulse counter 10 to measure the input pulse train. Therefore, it will complete its count sequence in a time which is the input pulse train period divided by N. As a result, the recycling timer 16 can produce a series of pulses which are spaced by the original pulse period divided by N. The division is performed without having to have an explicit set of logic hardware to divide the number represented on the wires 15 by the number N, as would be necessary if the pulse counter 10 and the recycling timer 16 used the same clock frequency. Each pulse output from the second recycling timer 16 comes out on a different wire in the group 18 containing N wires. Each of the wires in the group 18 is used to control a different phase of the output pulse set. Thus the first pulse receives the signal SET1 on wire 19, the second receives the signal SET2 on wire 20, etc down to the last pulse receiving the signal SETn on wire 21 as shown.

The signals for generating a particular output are the SET and RES wires which go first through a digital filter, 26, 31, and 36, and then activate a set-reset (SR) flip flop 29, 34 . . . 39. As an example, consider the circuit for generating output OUT1 on wire 30. This output is formed using the SET1 signal on wire 19 and the RES1 signal on wire 23. The digital filter 26 examines the sequence of signals on SET1 and RES1, and prevents the sending of two set or reset signals in sequence without the other signal occurring in between in time. This function is necessary for proper operation in the case when the input pulse on 1 may have a width nearly equal to its period, or alternatively nearly equal to zero. In this case, small variations of the period of the input pulse can cause the sequence of the set and clear signals sent to the SR flip flop to be reversed, generating a faulty output pulse. The digital filter deletes the erroneous pulses so that the output signal does not cause a visible disturbance when used to drive a light emitting diode.

Output filtered signal set (FS) goes to the output flip flop 29 on wire 27, and filtered signal reset (FR) goes to the output flip flop 29 on wire 28. These signals are generated by the recycling timers 16 and 17 such that the output pulse on wire 30 for OUT1 will be a close replica of the input pulse train PWM on wire 1.

In a similar way, time delayed signals for the other outputs are filtered in digital filters 31 and 36, and used to operate flip flops 34 and 39 as shown. These generate the output pulses OUT2 and OUTn on wires 35 and 40. Output signals 2 through N have a time phase delay so that the OUT pulses are uniformly distributed across the input signal 1 period.

The circuit can produce any number of outputs up to the number n. For normal operation when there are no defective LED channels, and all channels are in use, then the 'divide by N' value supplied on wire 44 and the number of output channels OUT1-OUTN are the same. However, the circuit is adaptive, and if the number N supplied to the 'divide by N' block 6 is different (less than) the number of channels available, the operation is different. Suppose that the number of outputs desired to be active (and therefore uniformly dispersed over the period of the input signal from pulse generator 100) is the value K, where K<N. Then the first K output channels OUT1-OUTK will produce the desired dispersed pulse outputs, and the output channels OUT(K+1)-OUTN will either not operate or produce signals which are not useful. Since these latter signals will not be used in this case, that discrepancy is not of significance. In this case, only the output channels OUT1-OUTK will be used by following circuitry The number of filters and SR flip flops used would be chosen to be able to supply the maximum number of time phase output pulse trains desired. As shown here, N sets of output circuits are used, permitting generation of N separately phased output pulses. The output signals OUT1, OUT2, and OUTn, are examples of output signals which would be used to control the different pulse phases for LED strings being powered by the chip containing the disclosed circuitry. The number of output signals OUTx, would correspond to the number N used to divide the clock frequency N. These LED strings would in turn typically be used for the back lighting of a display panel for a digital computer display, for example. Use of current pulses in the LED strings to control their brightness by variation of the pulse ON/OFF duty cycle ratio gives better control of the apparent color of the LED illumination. If the LED brightness were varied by controlling their current over a wide dynamic range, the apparent color of the LED would shift substantially. This problem is particularly apparent in the use of white LED diodes, which usually contain a blue or ultraviolet LED, with a white phosphor mix applied on top of the diode. Due to nonlinear energy conversion characteristics, the LED illumination and the phosphor conversion efficiency and color change with the current applied to the LEDs.

The operation of the circuit shown in FIG. 1 is as follows. Consider first the pulse counter 10. This counter increments every 1/N pulses from the CLK input source at frequency Fclk, so its count progresses at a rate slower than it would if the divide by N block 6 were not present. Therefore the number M on wire 11 is the period of the input pulse at 1, measured with time units of N/Fclk. This number M is then used to set the division modulus of the counters used in the recycling counters 16 and 17. Since these counters 16 and 17 receive the direct clock frequency Fclk, they effectively count at a rate N times faster than the counter 10. Each time they have accumulated a count equal to their input values MLE or MTE (which values are derived from and identical to M at 11 except for some time delay by the latches 12 and 14), these counters start over at count 0 and output a pulse on one of either the set lines 18 or the reset lines 22. So for each pulse period received from 1, the recycling timers 16 and 17 will accumulate a full count, output a pulse, and start over a total of N times. Thus the effective frequency of the pulses at the timer output, taken as a group, will be N times the pulse input frequency at 1. A decoder in the output of the recycling timer distributes its output pulses across the active channels, so that the SET1-SETN and RES1-RESN lines each receives a pulse once per input pulse period at 1 if they are active. The effective pulse frequency at 19-21 and 23-25 is the same as the input pulse frequency at 1, but the pulses generated are of different time phases, distributed across the period of the input pulse at 1.

Figure 2:
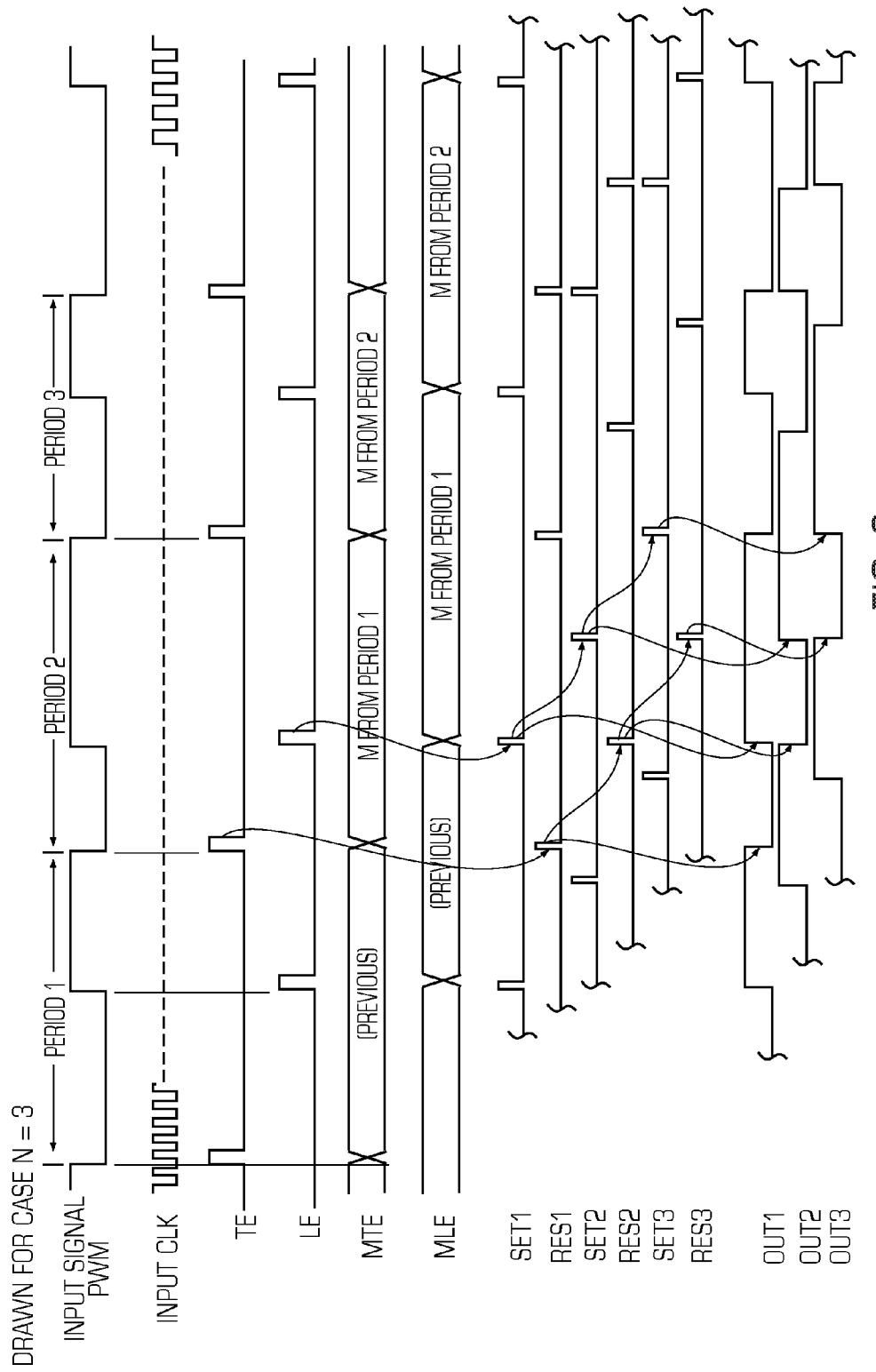
FIG. 2 is a timing diagram showing the operation of the circuit shown in FIG. 1.

FIG. 2 shows a typical waveform timing sequence which would be expected from the circuit of FIG. 1 for the case when N=3. The input signal PWM is shown at the top, with variations in its pulse duty cycle and period for each pulse. The input clock signal CLK is arbitrarily shown in part just to express the idea that Fclk is substantially greater than the frequency of the input signal PWM. No specific frequency or phase relationship is required between the signals PWM and CLK. The fact that there is no frequency or phase relationship means that the many digital signal interface activities in the system described herein may have some small time jumps or jitter, and that measured time values will be an approximation to the exact value. However, if the signal CLK is sufficiently fast compared to the input signal PWM as stated previously, the jitter will not be noticeable by an observer of a light emitting diode powered by the output phase shifted pulses.

The input signal PWM is first processed by the edge detector, yielding the trailing edge (TE) and leading edge (LE) pulses as shown. Time relationships shown in the drawing are qualitative only, and not intended to be exact. The TE pulse is used to control the pulse counter to measure the period of the input signal, giving the values MTE on the wires 13 and the value MLE on the wires 15. The timing drawing shows that these signals change where marked by X, and that between the X marks, the value is derived from the input signal for the period marked. Thus, the wires MTE contain the measured period for time period 1 starting at the end of period 1 and all through period 2. This value can then be used by the recycling timer 17 to generate the RES pulses as shown. A series of arrows shows which pulses are triggered by previous pulses. In a similar manner, the LE pulse is used to trigger the generation of the SET pulses with a sequence as shown. The wires MLE contain the measured period for time period 1 starting when LE occurs in the middle of period 2 for the time needed to generate the sequence of SET pulses.

Finally, at the bottom of FIG. 2 are shown the three reconstructed output pulses OUT1, OUT2, and OUT3. Note that the pulses are a faithful replica of the input signal pulses in terms of duty cycle and period, with a phase spacing of exactly the input pulse period divided by 3. The SET and RES pulses are used to operate the output SR flip flops to produce the pulses as shown.

Careful study of the operation of the circuit of FIG. 1 as disclosed in FIG. 2 shows that the output pulses are generated using a time delay extracted from period 1 and a duration determined by the LE to TE time in period 2. Therefore in the case where the input pulses are not stationary in pattern, but have substantial variation, some distortion of the output pulse pattern may occur. For normal applications such as controlling the brightness of a light emitting diode by variation of its current duty cycle, this distinction is not important as the input pulse period on wire 1 will be essentially constant.

Figure 3:
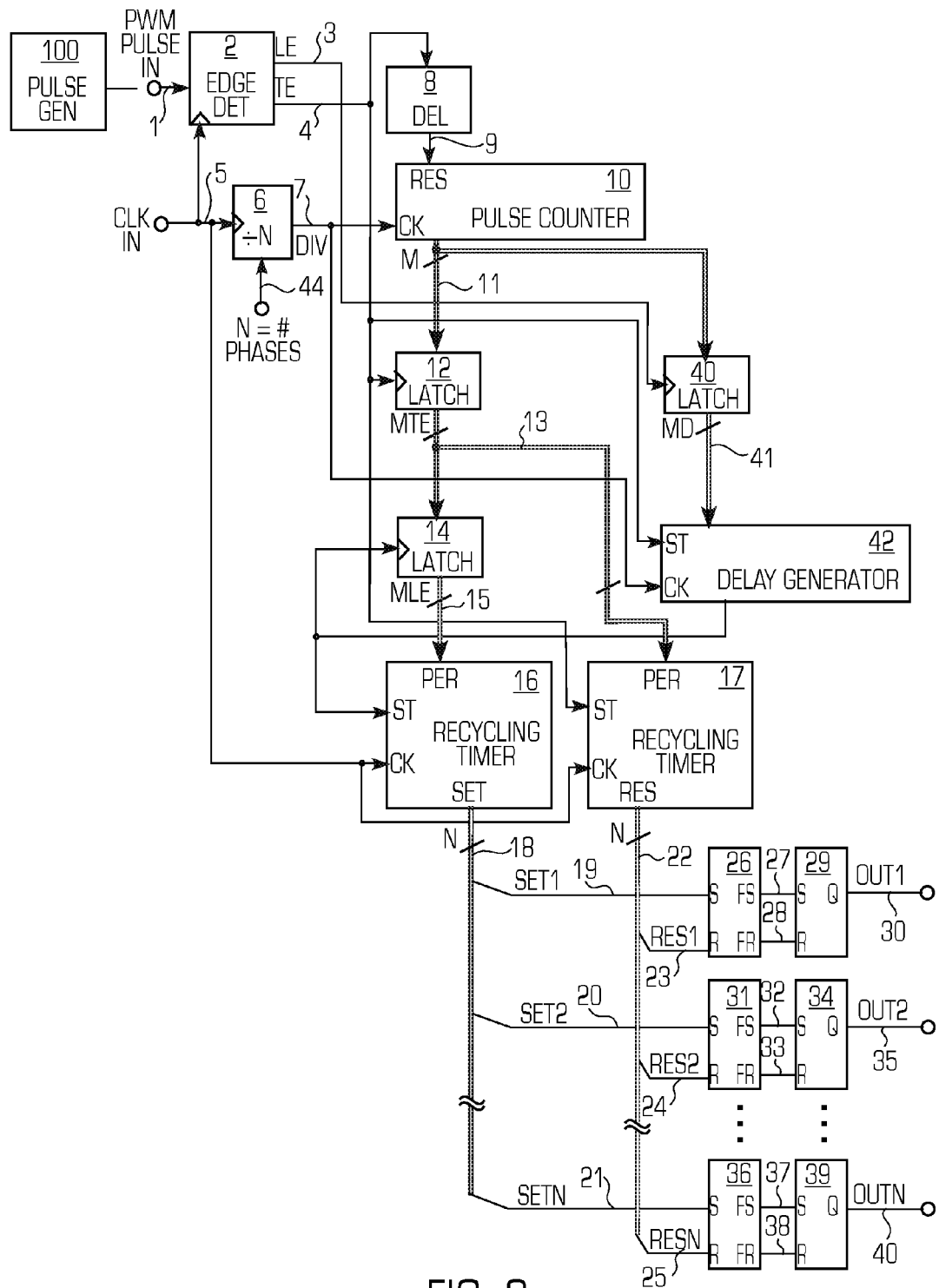
FIG. 3 is a circuit diagram of a second embodiment of the phase shift generating circuit of the present invention.

FIG. 3 shows a variation of the circuit of FIG. 1 which may be used to solve the difficulty mentioned above. In this case, an additional circuit has been added to measure the incoming pulse width between the trailing edge and the following leading edge. Recall that the pulse counter 10 starts over on its count each time the trailing edge pulse TE occurs on wire 4. A new latch 40 is added to save the value of the counter output M at the time of the leading edge pulse LE on wire 3. This count will then represent the delay between the input signal caused by TE and LE pulses. The output of the latch is the value MD on wire group 41.

The delay value MD goes next to a digital delay generator 42. This is a counter which is loaded with the delay value, and counts until the value is reduced to zero before producing an output. However, the pulse counter is using the frequency Fclk divided by N for measuring time, so the delay counter clock must also be connected to the signal DIV on wire 7, which is the same signal used to clock the pulse counter 10. Delay counter 42 starts operation when the TE pulse occurs, and outputs a pulse when its count reaches zero. At that time, it outputs a pulse on wire 43, which is used to operate the latch 14 and at the same time start the recycling timer 16. Therefore the recycling timer 16, which will produce the SET pulses for the output pulse generation, will be started at a time after the recycling timer 17 started exactly equal to the spacing of the TE and LE pulses in period 1. This guarantees that the regenerated pulses at OUT1 through OUTn will have corresponding periods and pulse widths in each cycle. Aside from the added latch 40 and delay generator 42 providing a new pulse to operate latch 14 and start timer 16, all the rest of the circuit in FIG. 3 operates the same as in FIG. 1. For many system usages, this additional circuitry added in FIG. 3 is not necessary, and the extra amount of hardware is not needed. Leaving out the items 40 and 42 of FIG. 3 to make the system discussed first in FIG. 1 may save some implementation cost and size.

In all of the counter, timer, and delay circuits discussed above, it is usually convenient to use a binary number representation for the values being transmitted between blocks. However, that is not a fundamental requirement, and nothing in this discussion should be construed to mean that a binary number system must be used. Any number system or other digital logic system that transmits the desired information is suitable and may be used.

Complementary circuit operation would be possible in an exactly similar way, with the LE and TE designations interchanged at appropriate places in the text and diagrams. The important thing here is that the output pulse trains are made to resemble the input pulse trains, perhaps with a polarity inversion, but containing the same timing information in terms of active duty cycle and frequency.

The disclosed circuit has the important property of creating a group of output pulses which has the active pulses uniformly distributed over the period of the input pulse (i.e. 1/frequency). The uniform spacing of the output pulses is important in that taken as a group, if all the pulses have the same timing properties and control LED currents of the same size, the effective acoustic and RF noise frequency associated with the LED high current pulses is multiplied by the number of phases in use. Therefore a lower pulse frequency may be used, which may be advantageous for other reasons not discussed here, and yet the acoustic and RF frequency noise is pushed higher in frequency multiplied by the phase number N, perhaps to a value which people cannot perceive or hear, or which is far removed from troublesome system mechanical and electrical resonances.

Figure 4:
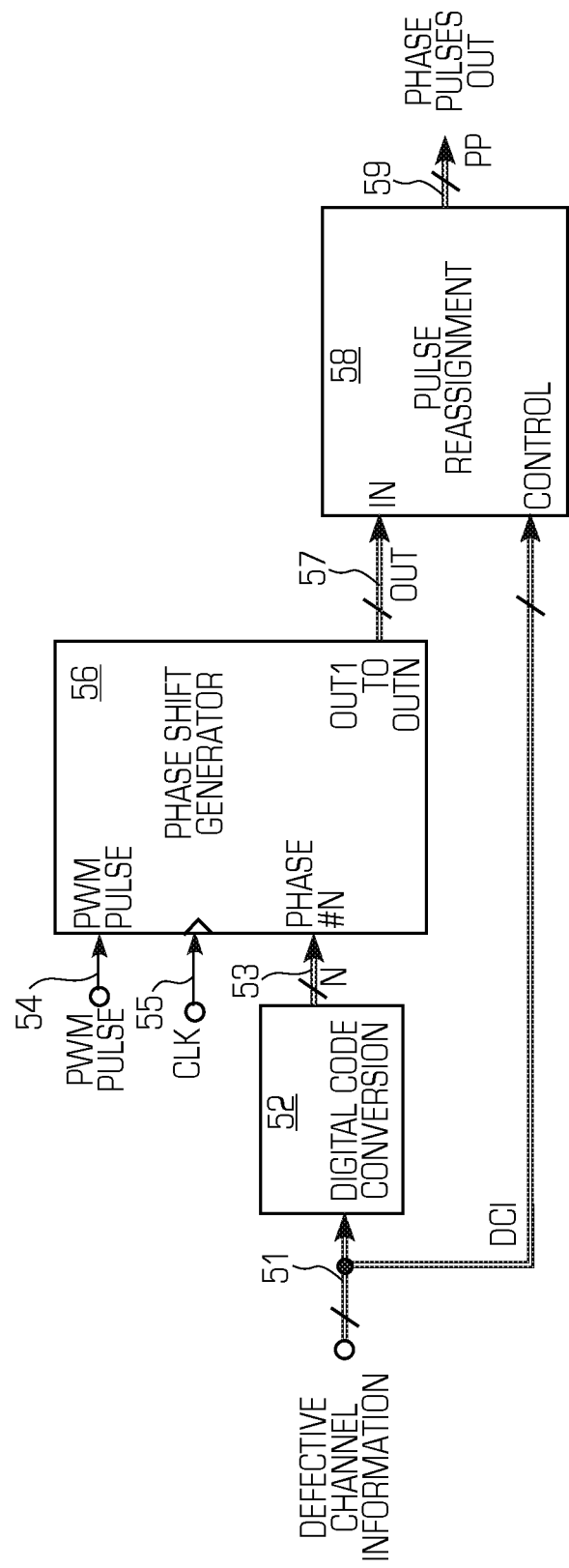
FIG. 4 is a circuit block diagram showing one use of the phase shift generating circuit of the present invention in a disabled channel compensation circuit.

FIG. 4 shows a phase shift generation system that has been augmented to provide compensation for defective or not enabled channels in the associated system. In this system the phase shift generator of FIG. 1 or FIG. 3 has been augmented by utilization of information from the associated system about which channels are functional, and which ones are defective or inactive. The disabled channel information (DCI) comes in on the wire group 51, where it first goes to a digital code conversion logic block 52. Typically the DCI information is in the form of a single wire per channel which indicates by its logic state whether the associated channel is functional or not. Thus, the DCI information on the wire 51 includes both enabled channel signals and disabled channel signals. The output of the digital code conversion block 52 is a group of wires 53 that form a code for the desired divider value N. Assume that each of the lines 51 is high if the channel is operating, and low if the channel is defective or turned off. Then the number N is conveniently a binary number representing the number of lines 51 which are in their high state, and so indicates the number of phases which should be generated at the output of the phase shift generator 56. This logic block may be built by any method known to the state of the art. The number N could be represented by any number system desired, including single wires per active channel phase to be generated. This number N then determines the number of different phases to be generated by controlling the divide by N counter 6 in FIG. 1 or 3. As before, the desired output pulse duty cycle and frequency are controlled by the input pulse PWM on wire 54, which goes to the edge detector 2 of FIG. 1 or 3. The clock input CLK on wire 55 is the same first clock as used as the input on wire 5 of FIG. 1 or 3. The phase shift generator 56 then produces a set of outputs on wires 57 with a number of distinctly different outputs corresponding to the number N from the digital code converter. The number of different outputs generated at 57 matches the number of phase pulses needed for the active outputs of the line group 59 for the phase pulses.

If any channel in the associated system has failed or is turned off or is simply disabled, then the number of unique outputs on the wires 57 is less than the number of channel connections present on the wires 59. Therefore a signal reassignment must be done. The pulse reassignment block, made using digital logic as known in the state of the art, transmits the unique outputs of the phase shift generator 56 to the channel connections in the wire group 59 which correspond to active or enabled channels. Thus, the re-routing of the signals by the Pulse Reassignment circuit 58, reroutes the output of the N signals 57 from the phase shift generator 56 to the enabled channel signals portion of the signals on wire 59. The DCI signals provided to the phase shift system by the associated system are input to the pulse reassignment block 58 to control the input-to-output signal routing. Therefore the active channels in the associated system will receive proper phase shifted PWM signals, and produce uniformly distributed pulses across the time of the PWM pulse period.

As previously discussed, the number of output channels on wire 57 can be the maximum number of values in the divide by N supplied on wire 53. However, in the event when one or more of the LED output channels is not in use, either due to defective operation having been detected, or due to the choice of the user, the value of 'N' is changed to match the number of output channels which are desired to operate (i.e., the value K), and therefore to be uniformly distributed over the period of the input pulse '1' from generator 100. The pulse reassignment block 58 of FIG. 4 uses the information about which channels are defective '51' (or conversely, still operating) to cause the first K channels OUT1-OUTK which are operating at the output of the phase shift generator block 56 to be assigned to the phase pulses PP 59 which correspond to the active LED channels.

Note that although the discussion above assumes the use of a phase shift generator as shown in FIG. 1 or 3, any logic system which performs the same task may be used in FIG. 4 as item 56. The use of the exemplary systems of FIG. 1 or 3 is not restrictive to the correction operations performed in FIG. 4.

The augmented system disclosed in FIG. 4 has the important property that if an LED output phase is found to nonfunctional by other means, it can be removed from the phase group timing, and the remaining active outputs uniformly distributed, so that there is no noise at the fundamental pulse rate, but it is still multiplied up to a higher frequency.

From the foregoing it can be seen that several versions of the phase shift circuit of the present invention are possible, with the principle of operation being based on use of a counter to measure the input pulse characteristics. Additional digital counters or delay circuits are then used to generate replicas of the input pulse train with the desired phase shift. Use of a clock as the time base for the counters which has a frequency Fclk that is many times faster than the input pulse frequency can give a good approximation to the input pulse characteristics. One of the principles of this system is that use of a fast clock gives time resolution such that the approximation to the actual pulse shape is satisfactory for the application. In the case of a phase shift pulse generator for light emitting diode (LED) dimming, for example, it may be sufficient to have a Fclk which is 256 or more times the frequency of the input pulse. In this case, the input pulse properties would be measured with an accuracy of one part in 256 of its period. Use of a faster clock gives proportionally better accuracy. For the example system here, the input clock frequency is Fclk=24 MHz, and the input pulse frequency is Fpulse=200 to 20,000 Hz, so the period accuracy is between one part in 1200 and one part in 120,000. This fine resolution is better than the brightness resolution of the eye, so use of the pulse to control the brightness of an LED would give digital steps too small to be resolved by a person viewing it. Furthermore, although the various delay measurement and generating circuits in the examples described herein are digital, the present invention may be implemented with analog circuits for these functions as well. Finally, although the invention has been described with respect to the circuit shown in FIGS. 1, 2 and 3, which uses counters, and latches and timer circuits, the invention can also be realized by the use of a microcontroller with appropriate software, which receives the clock signal 5 and the divide by N value 44, and the pulse width train signal 1 and generates the plurality of output signals 30, 35 . . . 40 etc.

What is claimed is:

1. A phase shift generating circuit for receiving a pulse width modulated pulse train signal having a first frequency and a first clock signal having a second frequency with the second frequency greater than the first frequency, said circuit comprising:
   an edge detection circuit for receiving the pulse train signal and the first clock signal and for outputting a leading edge signal in response to the leading edge of the pulse train signal, and a trailing edge signal in response to the trailing edge of the pulse train signal;
   a circuit for receiving a signal representing an integer N and the first clock signal and for generating a second clock signal having a second frequency, wherein said second frequency is the first frequency divided by the integer N;
   a pulse counter for receiving the leading edge signal or the trailing edge signal and the second clock signal to store a digital number corresponding to a period of the pulse train signal;
   a first timer circuit for receiving the first clock signal and the digital number and for outputting a plurality of set signals with each set signal generated from each pulse of the first clock signal and provided on a different set output line;
   a second timer circuit for receiving the first clock signal and the digital number and for outputting a plurality of reset signals with each reset signal generated from each pulse of the first clock signal and provided on a different reset output line;
   N storages, each storage having a set input for receiving one of said plurality of set signals and a reset input for receiving one of said plurality of reset signals, and an output;
   a first latch for storing the digital number corresponding to a period of the pulse train signal from the pulse counter, and having a first output, supplied to the first timer circuit, with said first latch triggered by said trailing edge signal; and
   a second latch for storing the digital number corresponding to a period of the pulse train signal from the first latch, and having a second output, supplied to the second timer circuit, with said second latch triggered by said leading edge signal;
   wherein the output of said N storages is N output signals with each output signal having a time phase delay with the commencement of the plurality of output signals distributed over a period of the pulse train signal.

2. A phase shift generating circuit for receiving a pulse width modulated pulse train signal having a first frequency and a first clock signal having a second frequency with the second frequency greater than the first frequency, said circuit comprising:
   an edge detection circuit for receiving the pulse train signal and the first clock signal and for outputting a leading edge signal in response to the leading edge of the pulse train signal, and a trailing edge signal in response to the trailing edge of the pulse train signal;
   a circuit for receiving a signal representing an integer N and the first clock signal and for generating a second clock signal having a second frequency, wherein said second frequency is the first frequency divided by the integer N;
   a pulse counter for receiving the leading edge signal or the trailing edge signal and the second clock signal to store a digital number corresponding to a period of the pulse train signal;
   a first timer circuit for receiving the first clock signal and the digital number and for outputting a plurality of set signals with each set signal generated from each pulse of the first clock signal and provided on a different set output line;
   a second timer circuit for receiving the first clock signal and the digital number and for outputting a plurality of reset signals with each reset signal generated from each pulse of the first clock signal and provided on a different reset output line;
   N storages, each storage having a set input for receiving one of said plurality of set signals and a reset input for receiving one of said plurality of reset signals, and an output;
   a first latch for storing the digital number corresponding to a period of the pulse train signal from the pulse counter, and having a first output, supplied to the first timer circuit, with said first latch triggered by said trailing edge signal;
   a second latch for storing the digital number corresponding to a period of the pulse train signal from the pulse counter, and having a second output, with said second latch triggered by said leading edge signal; and
   a delay generator circuit for storing the digital number from the second latch, and for receiving the second clock signal, and for generating a trigger output signal; with said delay generator circuit triggered by the trailing edge signal;
   wherein the output of said N storages is N output signals with each output signal having a time phase delay with the commencement of the plurality of output signals distributed over a period of the pulse train signal.

3. The phase shift generating circuit of claim 2 further comprising:
   a third latch for storing the digital number corresponding to a period of the pulse train signal from the first latch, and having a second output, supplied to the second timer circuit, with said second latch triggered by trigger output signal.

4. The phase shift generating circuit of claim 3 further comprising:
   a plurality of digital filter circuits, with each filter circuit associated with each storage;
   wherein each filter circuit receives a set signal and a reset signal and supplies a filtered set signal and a filtered reset signal to each storage, with each storage receiving a filtered set signal at the set input, and a filtered reset signal at the reset input.

5. A phase shift generation system for receiving a first plurality of enabled and disabled channel signals, representative of enabled and disabled channel information, comprising:
- a digital code conversion circuit for generating a number N representative of the number of enabled channel signals within said plurality of enabled and disabled channel signals;
- a phase generating circuit for receiving a pulse width modulated pulse train signal having a first frequency and a first clock signal having a second frequency with the second frequency greater than the first frequency, and for outputting N output signals; wherein each of the plurality of N output signals has a time phase delay with the commencement of the plurality of N output signals distributed over a period of the pulse train signal;
- a first latch for storing the digital number corresponding to a period of the pulse train signal from the pulse counter, and having a first output, supplied to the first timer circuit, with said first latch triggered by said trailing edge signal; and
- a second latch for storing the digital number corresponding to a period of the pulse train signal from the first latch, and having a second output, supplied to the second timer circuit, with said second latch triggered by said leading edge signal.

6. A phase shift generation system for receiving a first plurality of enabled and disabled channel signals, representative of enabled and disabled channel information, comprising:
- a digital code conversion circuit for generating a number N representative of the number of enabled channel signals within said plurality of enabled and disabled channel signals;
- a phase generating circuit for receiving a pulse width modulated pulse train signal having a first frequency and a first clock signal having a second frequency with the second frequency greater than the first frequency, and for outputting N output signals; wherein each of the plurality of N output signals has a time phase delay with the commencement of the plurality of N output signals distributed over a period of the pulse train signal;
- a first latch for storing the digital number corresponding to a period of the pulse train signal from the pulse counter, and having a first output, supplied to the first timer circuit, with said first latch triggered by said trailing edge signal;
- a second latch for storing the digital number corresponding to a period of the pulse train signal from the pulse counter, and having a second output, with said second latch triggered by said leading edge signal; and
- a delay generator circuit for storing the digital number from the second latch, and for receiving the second clock signal, and for generating a trigger output signal; with said delay generator circuit triggered by the trailing edge signal.

7. The phase shift generating circuit of claim 6 further comprising:
- a third latch for storing the digital number corresponding to a period of the pulse train signal from the first latch, and having a second output, supplied to the second timer circuit, with said second latch triggered by trigger output signal.

* * * * *